Figure 1:
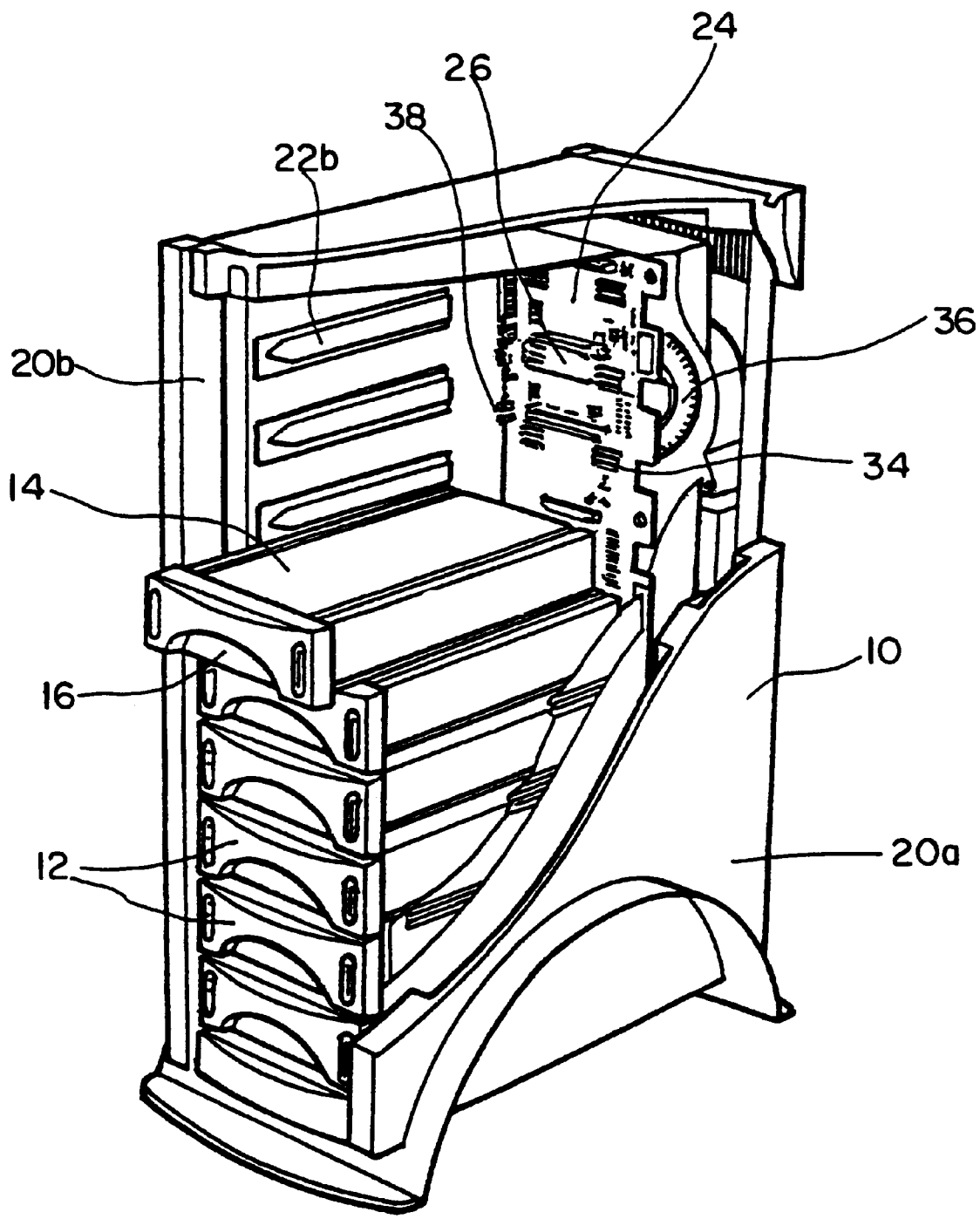

United States Patent
O'Sullivan et al.

[11] Patent Number: 6,050,658
[45] Date of Patent: Apr. 18, 2000

[54] CARRIER FOR AN ELECTRONIC DEVICE

[75] Inventors: Hans O'Sullivan, County Wicklow; Brendan Farrell, County Dublin, both of Ireland

[73] Assignee: Richmount Computer Limited, Dublin, Ireland

[21] Appl. No.: 09/027,974

[22] Filed: Feb. 23, 1998

[51] Int. Cl.[7] .................................................. A47B 81/00
[52] U.S. Cl. ..................... 312/223.1; 312/223.2
[58] Field of Search ............................. 312/223.1, 223.2, 312/333, 330.1; 211/26; 361/683, 685, 724, 725, 726, 727

[56] References Cited

U.S. PATENT DOCUMENTS

| | | | |
|---|---|---|---|
| 5,332,306 | 7/1994 | Babb et al. ........................ | 312/223.1 X |
| 5,490,723 | 2/1996 | Driscoll et al. .................. | 312/223.1 X |
| 5,588,728 | 12/1996 | Eldridge et al. .................. | 312/223.1 X |
| 5,684,671 | 11/1997 | Hobbs et al. ..................... | 312/223.2 X |
| 5,729,060 | 3/1998 | Shih ................................... | 361/685 X |
| 5,737,189 | 4/1998 | Kammersgard et al. ........ | 312/223.2 X |
| 5,765,933 | 6/1998 | Paul et al. ........................ | 312/223.1 X |

FOREIGN PATENT DOCUMENTS 568754  7/1996  Ireland .

Primary Examiner—Peter M. Cuomo
Assistant Examiner—James O. Hansen
Attorney, Agent, or Firm—Woodcock Washburn Kurtz Mackiewicz & Norris LLP

[57] ABSTRACT

A carrier for an electronic device comprises a hollow casing (14) for accomodating the electronic device, which casing is configured for sliding insertion into and out of a rack. A latch (46) at the rear of the casing releasably retains the casing in the rack, and an actuating rod (52) extends from the front of the casing to the latch to operate the latter. A lock (104) on the front (16) of the carrier releasably locks the actuating rod (52) in the latched position of the latch (46) to prevent unauthorised withdrawal of the carrier from the rack.

10 Claims, 11 Drawing Sheets

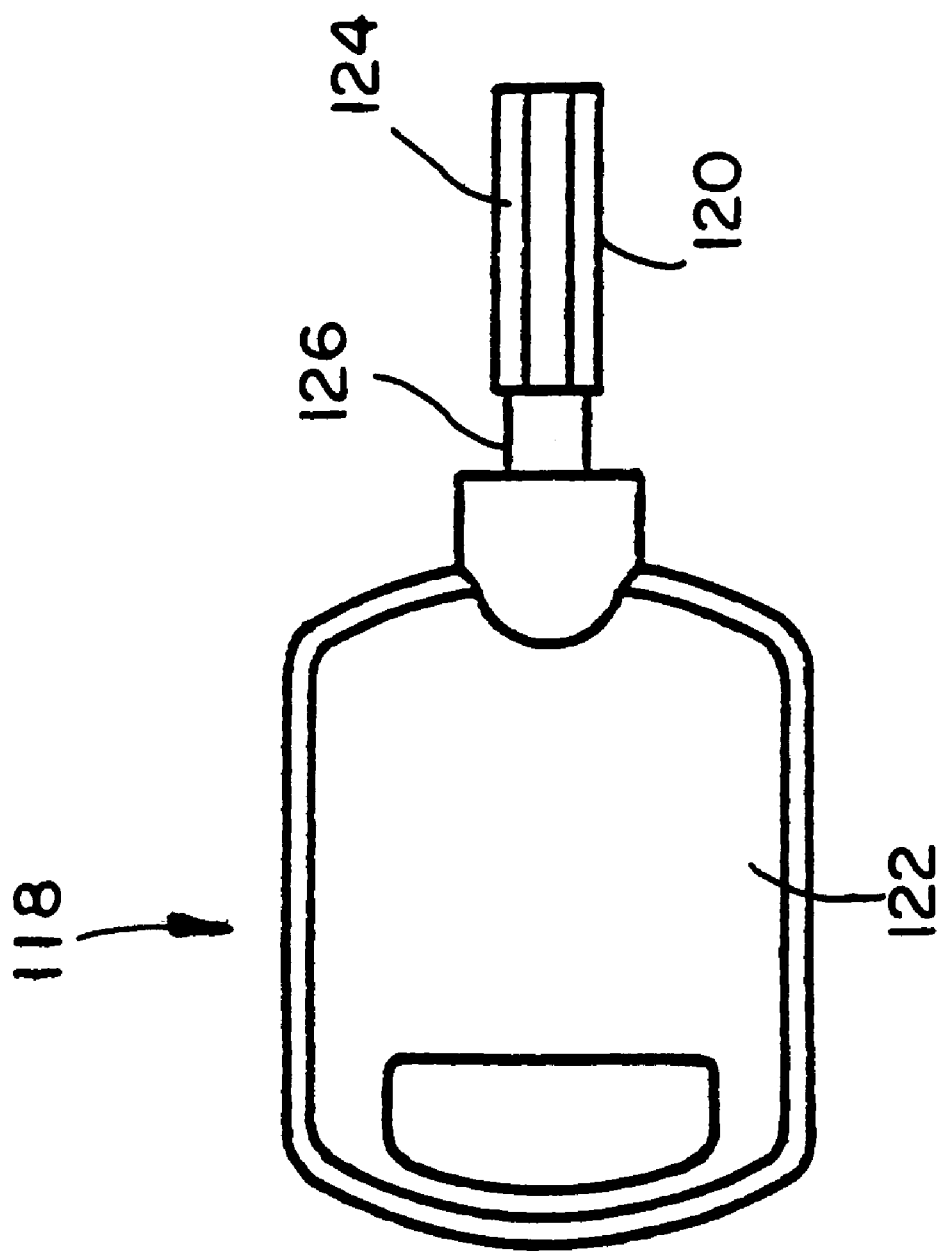

CARRIER FOR AN ELECTRONIC DEVICE

This invention relates to a carrier for an electronic device, for example a disk drive for data storage.

According to the invention there is provided a carrier for an electronic device, the carrier comprising a hollow casing for accomodating the electronic device, which casing is configured for sliding insertion into and out of a rack, latch means at the rear of the casing for releasably retaining the casing in the rack, an elongated latch-actuating member extending from the front of the casing to the latch means and slidable longitudinally of the casing between a first position wherein the latch means is in a latched position and a second position wherein the latch means is in an unlatched position, spring means biassing the latch-actuating member to its first position, the latch-actuating member being manually movable from its first position to its second position against the spring bias, and lock means for releasably locking the latch-actuating member in its first position.

There is also provided, as an independent invention, a carrier for an electronic device, the carrier comprising a hollow casing for accomodating the electronic device, which casing is configured for sliding insertion into and out of a rack, and an electrically conductive electromagnetic (EM) shield across the front of the casing, the EM shield including means for electrical connection with the EM shields of neighbouring device carriers in the rack.

Figure 2:
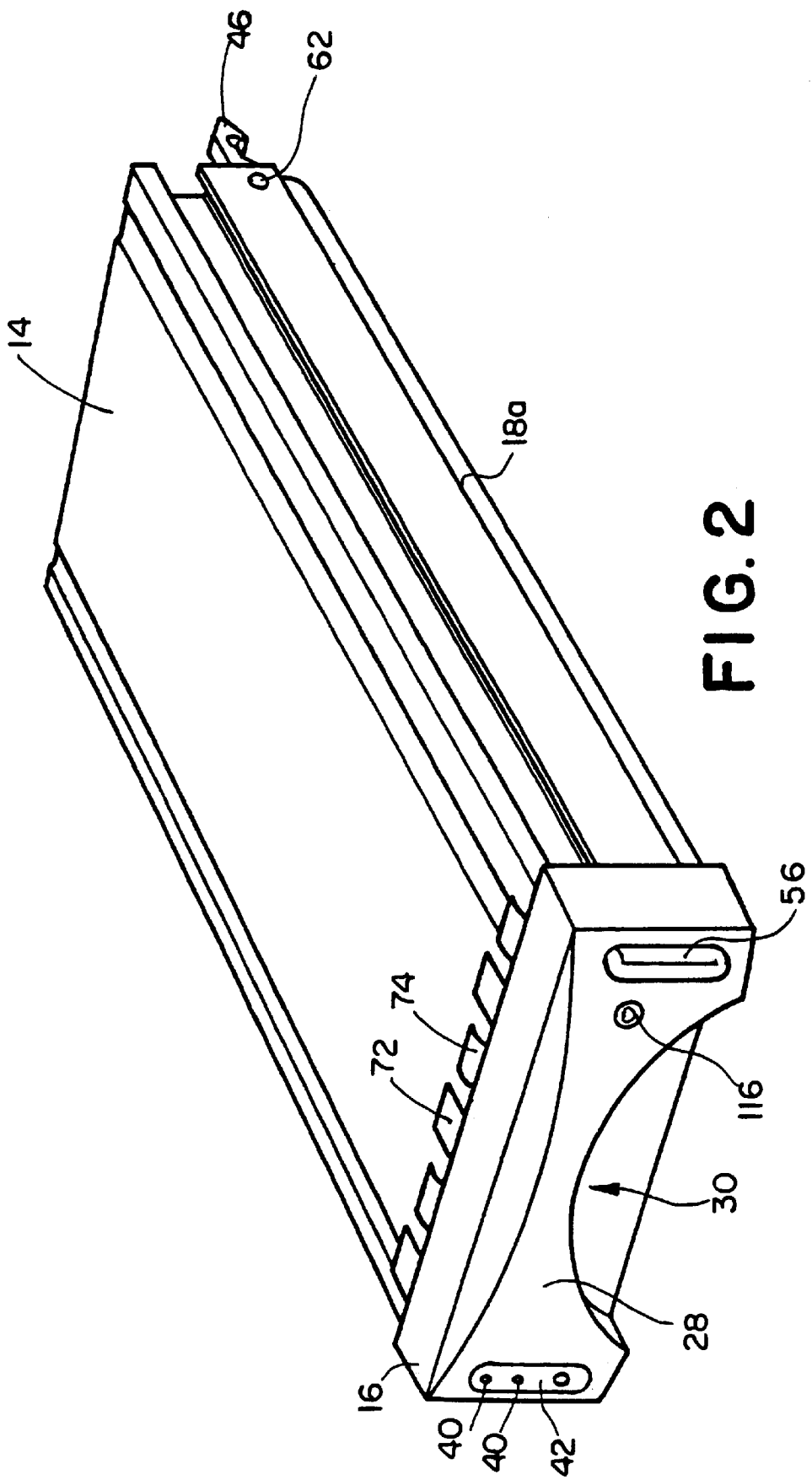
Figure 3:
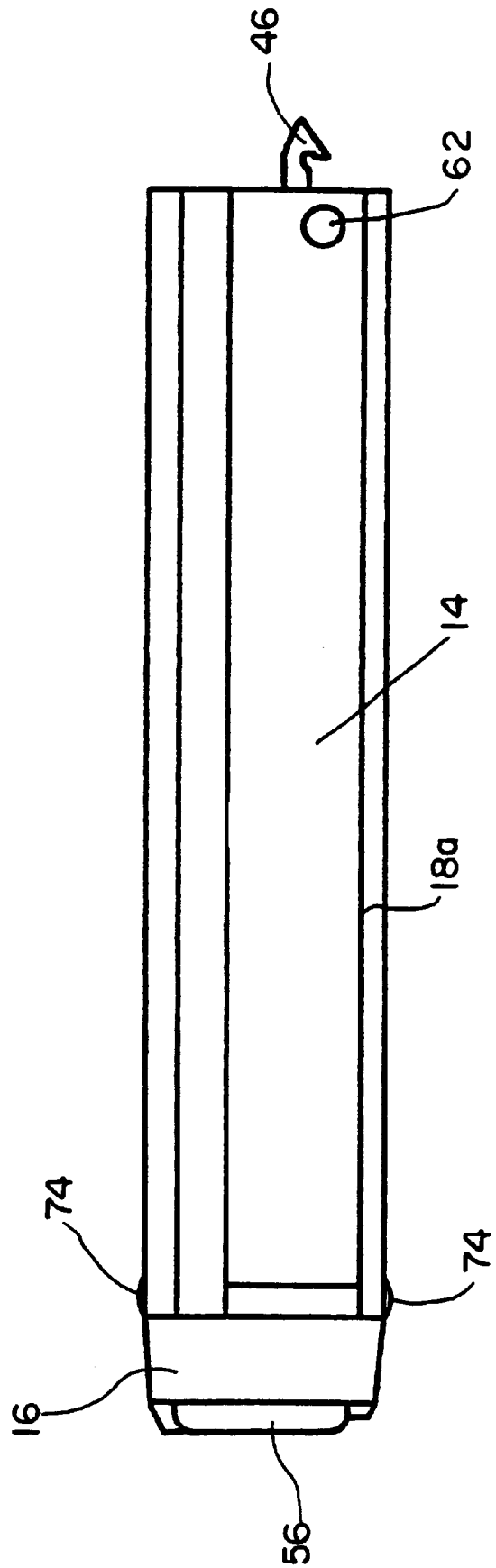
Figure 4:
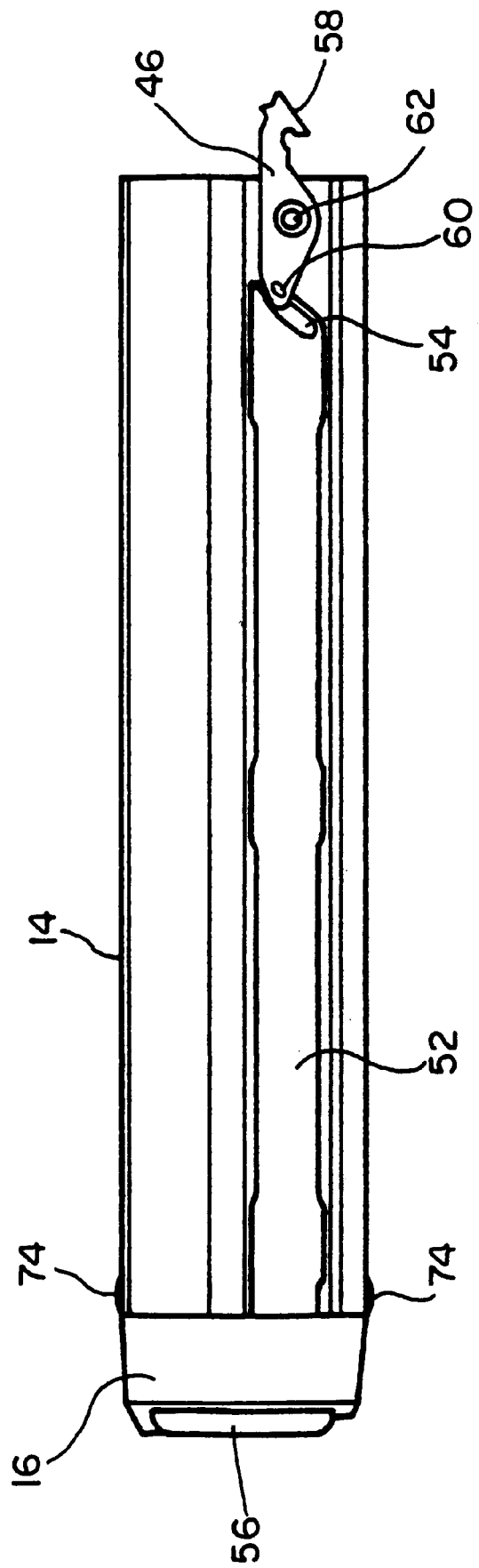
Figure 5:
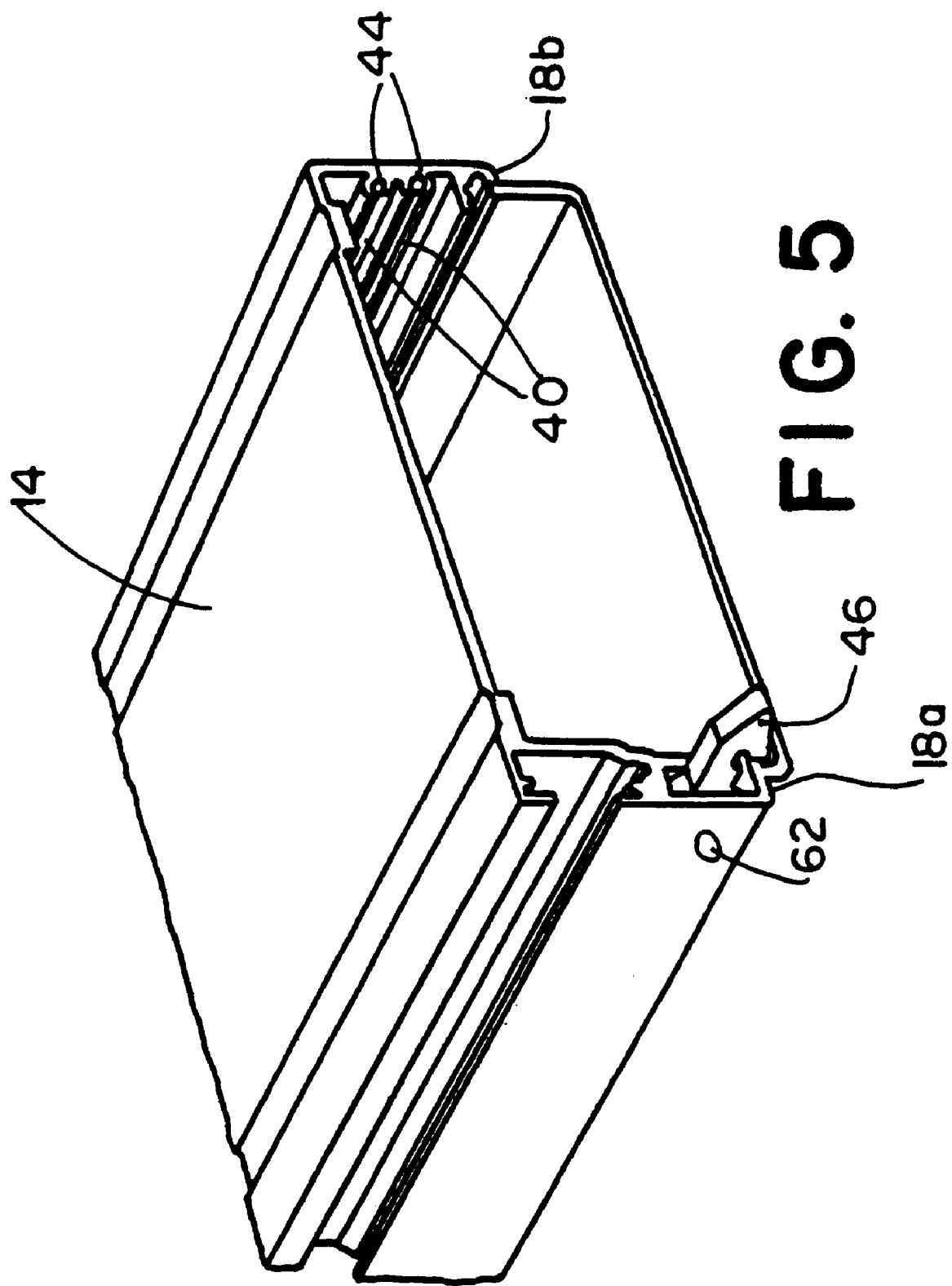
Figure 6:
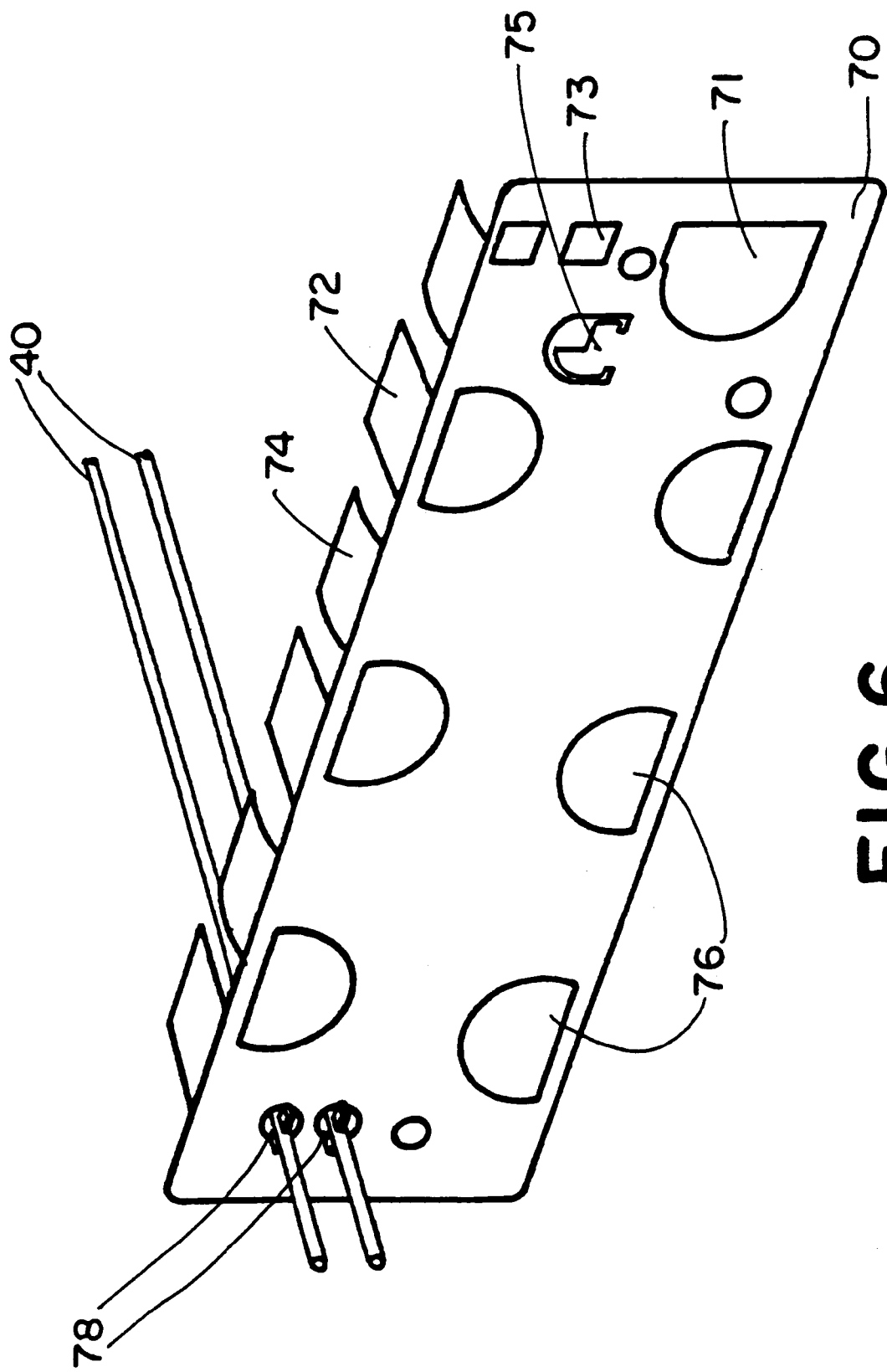
Figure 7:
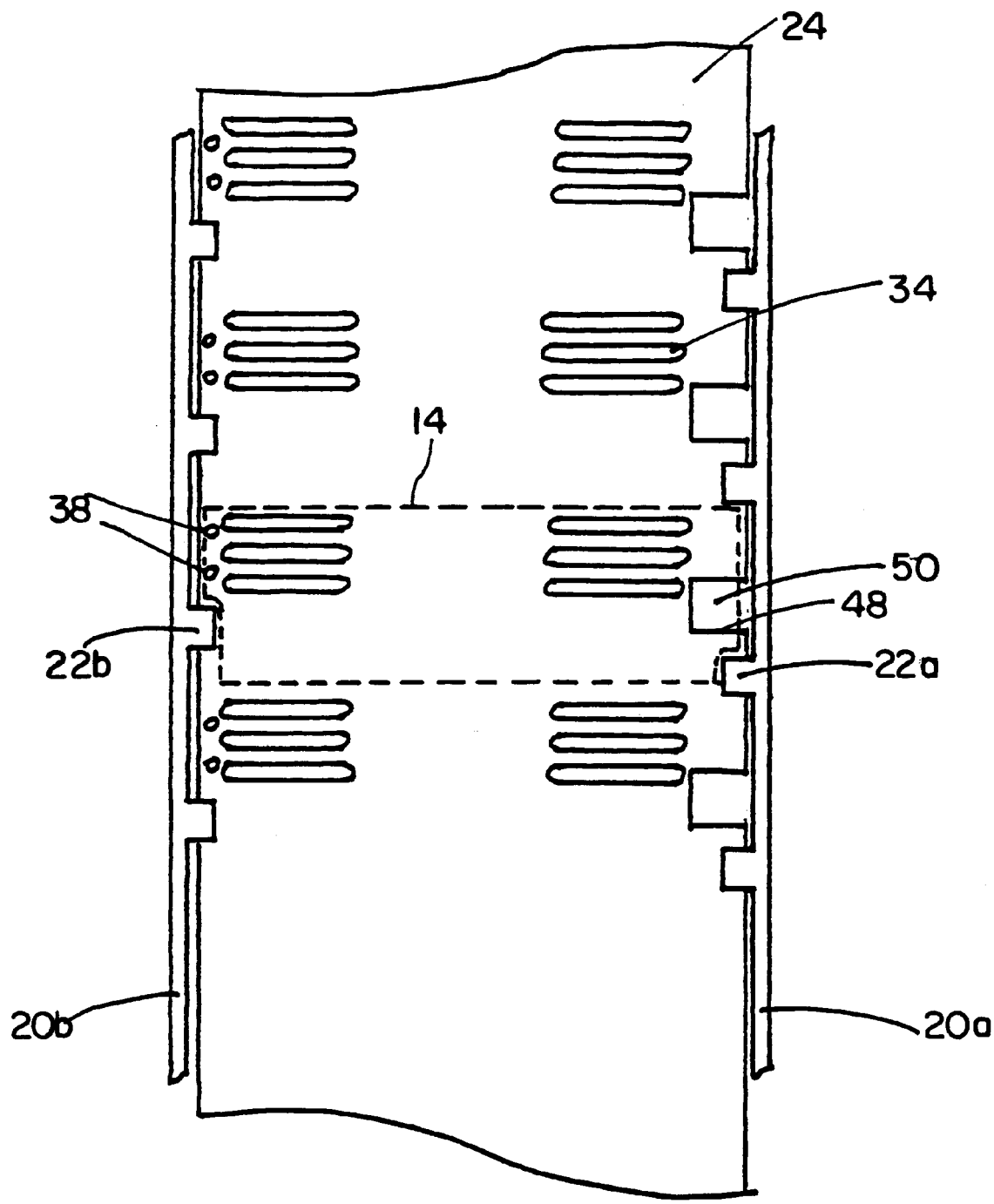
Figure 8:
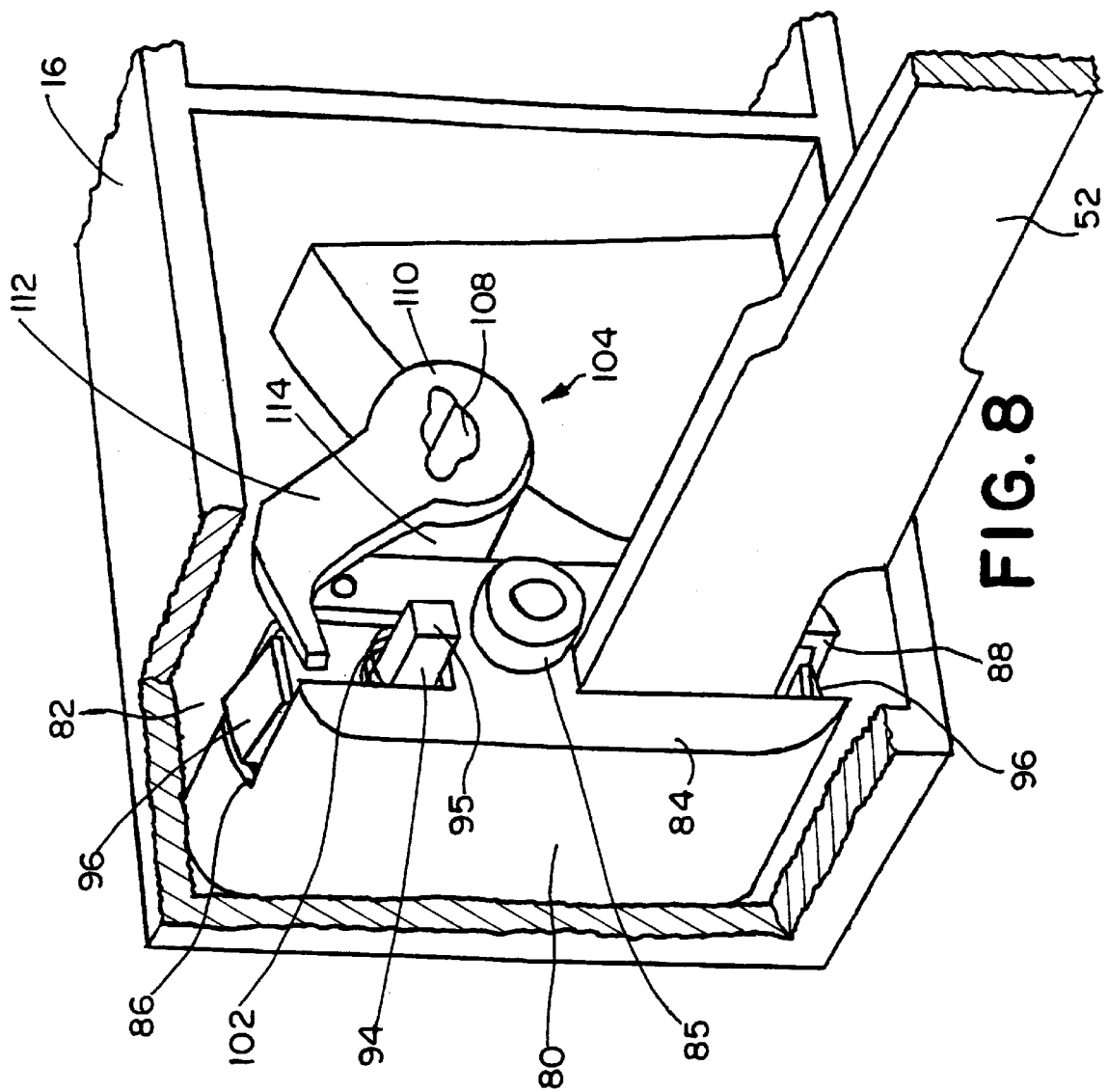
Figure 9:
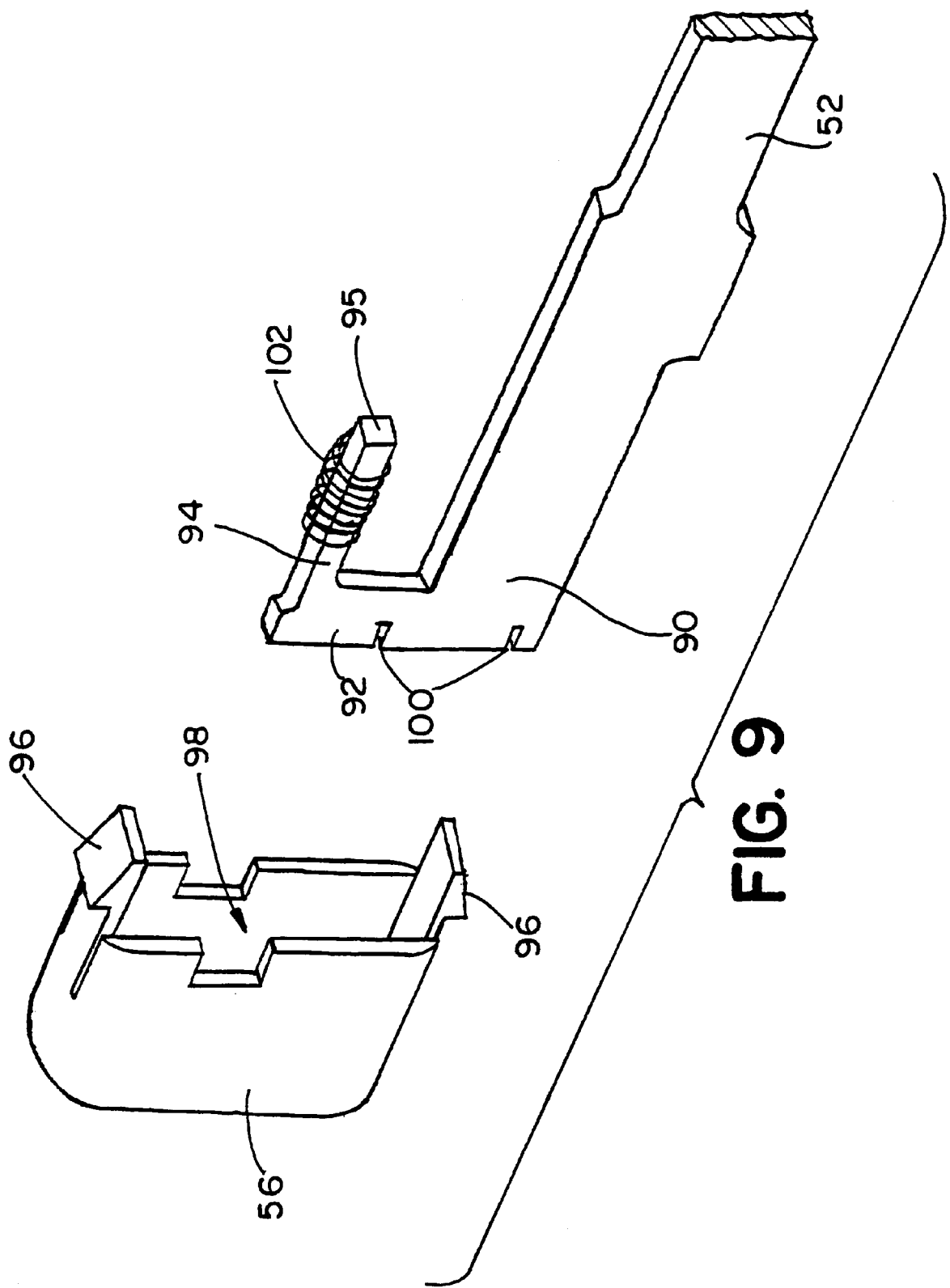
Figure 10B:
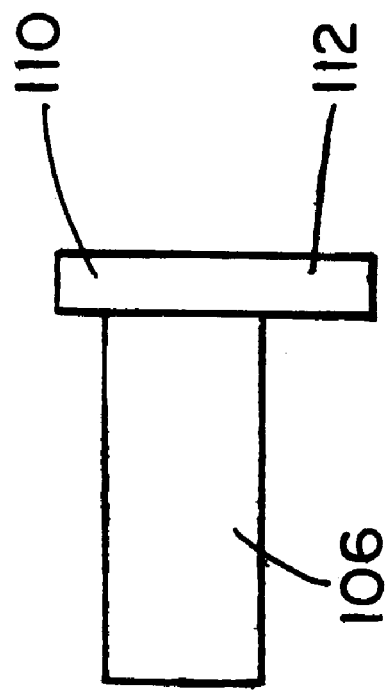
Figure 10A:
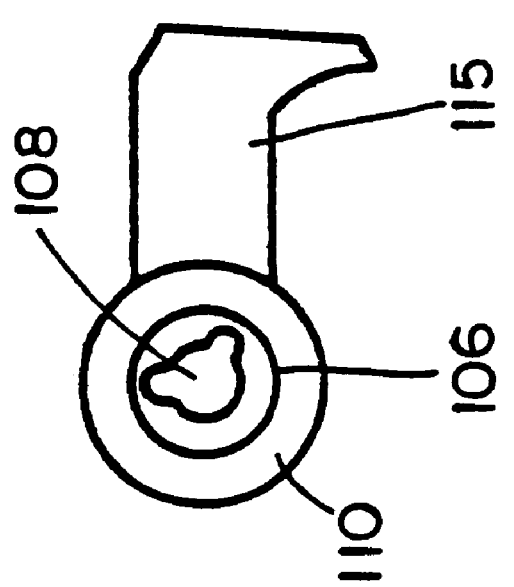

An embodiment of the invention will now be described, by way of example, with reference to the accompanying drawings, in which:

FIG. 1 is a perspective view of a rack holding a number of electronic device carriers according to an embodiment of the invention, the rack being partially cut away to show part of the back plane, FIG. 2 is a front three-quarter perspective view of one of the device carriers of FIG. 1, FIG. 3 is a side view of the device carrier, FIG. 4 is a side view of the device carrier with the latch mechanism exposed, FIG. 5 is a rear three-quarter perspective view of the rear end of the device carrier, FIG. 6 is a perspective view of an EM shield forming part of the device carrier, FIG. 7 is a simplified view of the rack as seen from the front, such view being simplified to omit much of the detail of the back plane, FIG. 8 is an enlarged detailed cut-away perspective view of the lock mechanism at the rear of the right hand side (as viewed from the front) of the device carrier front panel, FIG. 9 is a perspective view of the manual push button and actuating rod of FIG. 8, FIGS. 10A and 10B are front and side view respectively of the lock of FIG. 8, and FIG. 11 shows a key to operate the lock.

Referring now to the drawings, a rack 10, FIG. 1, accomodates a plurality of device carriers 12 which are independently and removably inserted in the rack one above the other. Each device carrier 12 comprises a hollow casing 14 having a substantially constant rectangular cross-section. The casing 14, which may be a single aluminium extrusion, is open at the rear and closed at the front by a panel 16. The casing 14 is adapted to accomodate an electronic device, not shown, such as a disk drive for data storage. Although the following will primarily describe the construction and operation of one of the device carriers 12, it will be understood that such description applies to each of the device carriers 12.

A respective shoulder 18a, 18b is provided along each side of the casing 14, as most clearly seen in FIG. 5. These shoulders are at slightly different heights on either side of the casing 14. The rack 10 has opposite parallel sidewalls 20a, 20b, and on its internal surface each sidewall 20a, 20b has a respective set of parallel runners 22a, 22b (FIG. 7) disposed horizontally one above the other. Each runner 22a on the sidewall 20a is slightly higher than a corresponding runner 22b on the sidewall 20b, the difference in height between opposite pairs of runners 22a, 22b being equal to the difference in height between the shoulders 18a and 18b. When the casing 14 is inserted into or withdrawn from the rack 10 the shoulders 18a, 18b slide along a corresponding pair of the runners 22a, 22b, and the matching differences in height of the pair of shoulders and the pair of runners ensure that the casing extends substantially horizontally between the sidewalls 20a, 20b.

The rack 10 has a back plane 24 bearing electronic circuitry 26 for operating the disk drive or other electronic device in the casing 14. The electronic device has an edge connector (not shown) projecting from the rear of the casing 14 and when the casing is fully inserted into the rack 10 the edge connector mates with a complementary edge connector associated with the electronic circuitry 26 on the back plane 24. This enables power, control and data tracks on the back plane to be electrically connected to the electronic device in the casing 14, thus enabling remote control and transfer of data to and from the electronic device. The construction and operation of such edge connectors in rack systems is well known in the art. The device carrier 12 is releasably retained in its fully inserted position in the rack 10 by a latch mechanism to be described.

A sheet metal electromagnetic (EM) shield 70, FIG. 6, is fitted across the open front of the casing 14 and the front cover 16, which may be moulded of plastics material, is fitted to the shield 70. Along its top edge the EM shield has alternate flat and arched fingers 72 and 74 respectively which extend rearwardly a short distance across the top surface of the casing 14. Along its bottom edge the EM shield has similar alternate flat and arched fingers 72, 74 (not shown) which extend rearwardly a short distance under the bottom surface of the casing 14. Each flat finger 72 along the top edge has an arched finger 74 directly below it on the bottom edge, and vice versa.

The arrangement is such that when a device carrier 12 is slid into the rack 10, each arched finger 74 along the top edge of the EM shield 70 resiliently engages a respective flat finger 72 on the bottom edge of the EM shield 70 of the device carrier 12 immediately above it in the rack, and likewise each arched finger 74 along the bottom edge of the EM shield resiliently engages a respective flat finger 72 on the top edge of the EM shield 70 of the device carrier 12 immediately below it in the rack. Thus, when the rack is fully occupied by device carriers 12, the EM shields 70 of all the device carriers are electrically connected together to provide, in effect, a single large EM shield down the front of the entire assembly. If desired, the flat fingers 72 could be omitted, so that the electrical connection is made between each arched finger 74 and the metal casing 14 of the adjacent device carrier. Since each EM shield 70 is electrically connected to its respective casing 14, this would have the same effect of providing a single large EM shield.

The front panel 16 includes an integral handle 28 which extends fully across the width of the front panel 16 and defines a blind recess 30 extending upwardly behind the handle. The front panel 16 further includes a plurality of vertical ventilation slots (not shown) which are hidden behind the handle 28 in the blind recess 30. The back plane 24 has two sets of horizontal ventilation slots 34 directly behind each carrier 12. Fans 36 are mounted behind the back plane 24 which, in use, draw cooling air through the ventilation slots, through apertures 76 in the EM shield 60, over the top of the electronic device in the casing 14, and finally through the ventilation slots 34 in the back plane 24.

The electronic circuitry 26 includes two LEDs 38 mounted on the back plane 24 behind each device carrier 12. In use these LEDs act as indicators of the operating status of the electronic device in the casing 14.

A pair of light guides in the form of optical fibres 40 are mounted on the inside of the casing 14 above the shoulder 18*b* and extend fully from the front to the rear of the casing 14. When the casing 14 is fully inserted into the rack 10 the rear end of each light guide 40 is directly in front of a respective one of the LEDs 38 so that light from the LED enters the light guide and is conducted to the front end thereof by total internal reflection. The front ends of the light guides 40 terminate just behind a window 42 in the front panel 16, so that the light emerging from the front ends of the light guide is visible at the front of the casing. Hence, a user can ascertain the operating status of the device in the carrier 12 via the front panel window 42 and light guides 40. This avoids the need for separate LEDs or other status indicator lamps at the front panel 16 and attendant wiring from the back plane through the casing 14. As seen in FIG. 5, the light guides 40 are mounted in respective grooves 44 on the interior of the casing 14, and pass through respective apertures 78 in the EM shield 70.

As mentioned, the device carrier 12 is releasably retained in its fully inserted position in the rack 10 by a latch mechanism.

The latch mechanism includes a hook member 46 mounted on the inside of the casing 14 adjacent the rear end thereof above the shoulder 18*a*, the hook member 46 projecting beyond the rear end of the casing 14. The hook member 46 is pivotted at 62 for rotation in a vertical plane between a latched position in which the hook member 46 engages behind the top edge 48 (FIG. 7) of a cut-out 50 in the back plane 24 to retain the casing 14 in the fully inserted position in the rack 10, and an unlatched position in which the hook member 46 disengages the top edge 48 to permit the casing 14 to be withdrawn from the rack.

An actuating rod 52, FIG. 4, extends along the inside of the casing 14 above the shoulder 18*a* from the front of the casing 14 to the hook member 46, and is slidable longitudinally relative to the casing 14. The rear end of the rod 52 has an inclined slot 54 and the hook member 46 has a projection 60, FIG. 10, which extends into the slot 54 in the manner of a cam follower such that to and fro movement of the actuating rod 52 causes rotation of the hook member 46 between its latched and unlatched positions. Compression spring means (to be described) biasses the rod 52 towards the front of the casing 14, thereby tending to rotate the hook member 46 to its latched position. A push button 56 in the front panel 16 is coupled to the rod 52 such that by pressing on the push button 56 the rod 52 may be moved manually towards the rear of the casing 14 to rotate the hook member 46 to its unlatched position against the spring bias.

In use, when the carrier 12 is inserted into the rack 10 by sliding along the runners 22*a*, 22*b*, the hook member 46 is in its latched position. As the carrier 12 approaches its fully inserted position, an inclined front edge 58 of the hook member 46 engages and rides up over the top edge 48 of the cut out 50. Finally, when the carrier 12 reaches its fully inserted position the front edge 58 of the hook member clears the top edge 48 of the cut out 50 and the hook member engages behind the top edge 48 to retain the carrier in the fully inserted position. When it is requires to withdraw the carrier 12 from the rack 10, the push button 56 is pressed which rotates the hook member 46 against the spring bias to its unlatched position clear of the top edge 48, allowing the carrier 12 to be withdrawn.

Referring now to FIGS. 8 to 10, the front panel 16 has a hollow housing 80 integrally formed on its rear surface 82. The housing 80 is open (not shown) at the front of the panel 16 and is closed at its base 84 except for upper and lower right-angled slots 86, 88 respectively, each of which extends partially up the sidewall at each narrow end of the housing 80 and partially towards the centre of the base 84.

The front end 90 of the actuating rod 52 extends into the housing 80 through the lower slot 88 and has a first arm 92 extending within the housing 80 towards the upper slot 86 and a second arm 94 extending rearwardly from the upper end of the arm 92 through the upper slot 86. The front end 90 of the rod 52 is assembled in the housing 80 in this manner by inserting the entire rod, rear end first, into the open front of the housing 80 from the front of the panel 16. As seen in FIG. 6, the EM shield 70 has suitable apertures 71 and 73 to allow passage of the rod 52 and arm 94 respectively.

The push button 56 in inserted into the housing 80 from the open front, and has a pair of resilient tabs 96 which snap engage the slots 86, 88 as seen in FIG. 8. The push button 56 has a hollow interior 98 and locates over the front end 90 of the rod 52, a pair of notches 100 on the latter engaging equivalent raised features on the interior surface of the button 56. A coil spring 102 surrounding the arm 94 is in compression between the interior surface of the base 84 and the arm 92, thereby biassing the rod 52 forwardly towards the front of the casing 14 and rotating the hook member 46 to its latched position. However, if the push button 56 is depressed, the rod 52 is moved rearwardly against the bias of the spring 102 and the hook member 46 is rotated to its unlatched position. The engagement of the tabs 96 with the forward edges of the slots 86, 88 limit the forward movement of the rod 52.

A lock 104 is provided to prevent unauthorised depression of the button 56 and removal of the carrier 12. The lock includes a cylindrical barrel 106 having a non-circular axial bore 108. At one end the barrel 106 has an annular flange 110, and an arm 112 extends radially from the flange. The barrel 106 is rotatably mounted in a hollow cylinder 114 integrally formed on the rear surface 82 of the front panel 16 next to the housing 80, the flange 110 bearing against the free end of the cylinder 114. The barrel 106 is held in the cylinder 114 by a resilient portion 75 of the EM shield 70 bearing against the flange 110. The front panel 16 has an aperture 116 (FIG. 2) whose cross-section is the same as that of the bore 108, the aperture 116 being positioned in axial alignment with the bore 108.

In FIG. 8, the lock 104 is shown in the unlocked position, which is to say the rod 52 is free to move rearwardly when the button 56 is pressed. To lock the rod 52 in the forward position, the barrel 106 must be rotated by about 45 degrees in the anticlockwise direction, as seen in FIG. 8, so that the radial arm 112 comes to rest against a boss 85 moulded to the base 84 of the housing 80. In this position the arm 112 is located in front of the rearwardly facing surface 95 of the arm 94, thereby blocking the latter, and hence the rod 52 as a whole, from rearward movement.

Rotation of the barrel 106 between the locked and unlocked positions of the lock 104 is effected by a key 118

(FIG. 11) having a shaft 120 and a head 122. The major portion 124 of the shaft 120 has a cross-section which is substantially the same as that of the aperture 116 and the bore 108, and a minor portion 126 of the shaft 120 between the portion 124 and the head 122 has a reduced circular cross-section.

In the locked position of the lock 104, i.e. when the radial arm 112 is positioned in front of the rearwardly facing surface 95 of the arm 94, the aperture 116 in the front panel 16 is in register with the bore 108. In this position of the barrel 106 the bore 108 is in register with the aperture 116 in the front panel 16. The shaft 120 of the key 118 may now be inserted through the aperture 116 and into the bore 108.

The length of the shaft portion 124 is such that when the key 118 is fully inserted into the barrel 106 the circular portion 126 of the shaft is aligned with the aperture 116. This allows the key 118 to be turned to move the barrel 106 to the unlocked position, i.e. the position seen in FIG. 8. Since the aperture 116 is no longer in register with the bore 108, the key cannot be removed from the barrel 106 in the unlocked position of the lock.

To lock the rod 52 once again in its forward position, the key is once more turned in the aperture 116 to bring the radial arm 112 in front of the surface 95, whereupon the key may be removed from the barrel 106.

We claim:

1. A carrier for an electronic device, the carrier comprising a hollow casing for accommodating the electronic device, the casing having a front and a rear and being configured for sliding insertion into and out of a rack from its rear, latch means at the rear of the casing for releasably retaining the casing in the rack, an elongated latch-actuating member extending from the front of the casing to the latch means and slidable longitudinally of the casing between a first position wherein the latch means is in a latched position and a second position wherein the latch means is in an unlatched position, spring means biasing the latch-actuating member to its first position, the latch-actuating member being manually movable from its first position to its second position against the spring bias, and lock means for releasably locking the latch-actuating member in its first position, wherein the latch-actuating member moves rearwardly relative to the casing from its first position to its second position and has a rearwardly facing surface at its front end, and wherein the lock means includes a member which can be selectively positioned in front of the rearwardly facing surface to block said rearward movement.

2. A carrier as claimed in claim 1, wherein the casing has a front panel whose rear surface is formed with a housing, wherein the front end of the latch-actuating member extends into the housing from the rear, and wherein the spring means is located in the housing.

3. A carrier as claimed in claim 2, wherein the housing is open at the front of the panel and receives a push button, the push button being coupled to the front end of the latch-actuating member.

4. A carrier as claimed in claim 2, wherein the spring means is a compression spring acting between an interior surface of the housing and the front end of the latch member.

5. A carrier as claimed in claim 1, wherein the casing has a front panel, wherein the lock means includes a cylindrical barrel rotatably mounted on the rear surface of the panel, the barrel having a radial extension which can be selectively positioned in front of the rearwardly facing surface of the latch-actuating member by rotation of the barrel, and wherein the barrel is rotatable by a key inserted therein through an aperture in the front panel.

6. A carrier as claimed in claim 5 wherein the barrel has an axial bore of non-circular cross-section, wherein the aperture in the front panel has substantially the same cross-section as the bore, and wherein the key has a shaft and a head, the shaft having a first portion whose cross-section is substantially the same as that of the bore and aperture to allow the shaft to be inserted through the aperture into the bore when the aperture and bore are in register, and the shaft further having a second portion between the first portion and the head having a cross-section which allows the key to be turned when the second portion is aligned with the aperture, the radial extension being in front of the rearwardly facing surface of the latch-actuating member when the aperture and bore are in register.

7. A carrier as claimed in any preceding claim, further including an electrically conductive electromagnetic (EM) shield across the front of the casing, the EM shield including means for electrical connection with the EM shields of neighbouring device carriers in the rack.

8. Rack-mounted electronic apparatus, comprising a rack removably accommodating a plurality of electronic device casings, each casing having a front and a rear and being slidably inserted into the rack from its rear so that the fronts of the casing are aligned vertically one above another, and each casing further including an electromagnetic shield extending across the front of each casing and occupying substantially the full width and height of the front of the casing, the shield having a top edge and a bottom edge, the shield further having electrical contact means disposed along at least one of said top and bottom edges for establishing an electrical connection with the shield which is immediately adjacent said at least one edge in the rack, whereby all the shields of the casings are electrically connected together.

9. Apparatus as claimed in claim 8, wherein the electrical contact means comprises a set of contact fingers disposed along said at least one edge, said set of contact fingers of a shield making direct electrical connection with an immediately adjacent shield.

10. Apparatus as claimed in claim 8, wherein each casing is made of metal, and wherein the electrical contact means comprises a set or contact fingers disposed along said at least one edge, said set of contact fingers of a shield making direct electrical connection with an immediately adjacent casing.

* * * * *